(12) United States Patent
Rahafrooz et al.

(10) Patent No.: US 12,348,213 B2
(45) Date of Patent: Jul. 1, 2025

(54) DUAL PROOF-MASS RESONATORS WITH LOW SUPPORT LOSS

(71) Applicant: Panasonic Intellectual Property Management Co., Ltd., Osaka (JP)

(72) Inventors: Amir Rahafrooz, Shaker Heights, OH (US); Diego Emilio Serrano, Alpharetta, GA (US)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 230 days.

(21) Appl. No.: 18/061,234

(22) Filed: Dec. 2, 2022

(65) Prior Publication Data

US 2024/0186975 A1 Jun. 6, 2024

(51) Int. Cl.
*H03H 9/02* (2006.01)
*H03H 9/24* (2006.01)

(52) U.S. Cl.
CPC ...... *H03H 9/02433* (2013.01); *H03H 9/2452* (2013.01); *H03H 2009/0244* (2013.01)

(58) Field of Classification Search
CPC ............. H03H 9/02433; H03H 9/2452; H03H 2009/0244
See application file for complete search history.

(56) References Cited

U.S. PATENT DOCUMENTS

| | | | |
|---|---|---|---|
| 6,909,221 B2 | 6/2005 | Ayazi et al. | |
| 6,930,569 B2 | 8/2005 | Hsu | |
| 7,176,770 B2 | 2/2007 | Ayazi et al. | |
| 7,492,241 B2 | 2/2009 | Piazza et al. | |
| 8,013,493 B2 | 9/2011 | Van Der Avoort | |
| 8,228,141 B2 | 7/2012 | Abdolvand et al. | |
| 8,593,032 B2 | 11/2013 | Phan Le et al. | |
| 8,624,471 B1 | 1/2014 | Ayazi et al. | |
| 9,954,513 B1 | 4/2018 | Thalmayr et al. | |
| 11,082,024 B1 * | 8/2021 | Hagelin | H03H 3/0072 |
| 11,909,376 B2 * | 2/2024 | Doll | H03H 9/2452 |

(Continued)

OTHER PUBLICATIONS

International Search Report of PCT application No. PCT/JP2023/028537, dated Oct. 17, 2023.

(Continued)

*Primary Examiner* — Tulsidas C Patel
*Assistant Examiner* — Mohammed Ahmed Qureshi
(74) *Attorney, Agent, or Firm* — McDonald Hopkins LLC

(57) ABSTRACT

Mechanical resonator includes two identical proof-masses, at least one connecting beam connecting the two identical proof-masses adapted to oscillate in a same phase in a direction perpendicular to a direction of a connecting beam, and at least one anchor attached to a middle of the at least one connecting beam. Two identical proof-masses are resonant plates, and the at least anchor is anchored to a substrate. The at least anchor may comprise two anchors attached to a middle of the at least one connecting beam in opposite directions. Also, the at least one connecting beam comprises an outer ring at a middle thereof, and the at least anchor is disposed at a center of the outer ring and is connected to the outer ring via two sub-connecting beams. The outer ring may be in a rectangular ring shape. Alternatively, the outer ring may be in a circular ring shape.

20 Claims, 4 Drawing Sheets

(56) References Cited

U.S. PATENT DOCUMENTS

2019/0227034 A1* 7/2019 Li .......................... H03B 5/30
2021/0265975 A1 8/2021 Kurita

OTHER PUBLICATIONS

F. Ayazi et al., "High-Aspect-Ratio SOI Vibrating Micromechanical Resonators and Filters", 2006 IEEE MTT-S International Microwave Symposium Digest, 2006, pp. 676-679, doi: 10.1109/MWSYM.2006.249705.

R. Abdolvand et al., "Thin-film piezoelectric-on-silicon resonators for high-frequency reference oscillator applications", IEEE Transactions on Ultrasonics, Ferroelectrics, and Frequency Control, vol. 55, No. 12, pp. 2596-2606, Dec. 2008, doi: 10.1109/TUFFC.2008.976.

G. Piazza et al., "Piezoelectric Aluminum Nitride Vibrating Contour-Mode MEMS Resonators", Journal of Microelectromechanical Systems, vol. 15, No. 6, pp. 1406-1418, Dec. 2006, doi: 10.1109/JMEMS.2006.886012.

G. Piazza et al., "Thin Film High Frequency Piezoelectric Resonators", Carnegie Mellon University, 2014, http://pwrsocevents.com/wp-content/uploads/2014-presentations/ts/S4_3%20Magnetics%20Piazza.pdf.

John Clark et al., "Microchip Oscillators and Clocks Using Microelectromechanical Systems (MEMS) Technology", 2017, pp. 1-12, https://ww1.microchip.com/downloads/en/DeviceDoc/00002344A.pdf.

Haoshen Zhu et al., "Design of Phononic Crystal Tethers for Frequency-selective Quality Factor Enhancement in AlN Piezoelectric-on-silicon Resonators", Procedia Engineering, vol. 120, 2015, pp. 516-519, ISSN 1877-7058, https://doi.org/10.1016/j.proeng.2015.08.689.

C. Cassella et al., "Reduction of anchor losses by etched slots in aluminum nitride contour mode resonators", 2013 Joint European Frequency and Time Forum & International Frequency Control Symposium (EFTF/IFC), 2013, pp. 926-929, doi: 10.1109/EFTF-IFC.2013.6702267.

J. L. Fu et al., "Dual-Mode AlN-on-Silicon Micromechanical Resonators for Temperature Sensing", IEEE Transactions on Electron Devices, vol. 61, No. 2, pp. 591-597, Feb. 2014, doi: 10.1109/TED.2013.2295613.

T. D. Ha et al., "Reducing anchor loss In thin-film aluminum nitride-on-diamond contour mode MEMS resonators with support tethers based on phononic crystal strip and reflector", Microsyst Technol 22, pp. 791-800, 2016, https://doi.org/10.1007/s00542-015-2678-1.

M. W. U. Siddiqi et al., "Aln-On-Si Mems Resonator Bounded By Wide Acoustic Bandgap Two-Dimensional Phononic Crystal Anchors", 2018 IEEE Micro Electro Mechanical Systems (MEMS), 2018, pp. 727-730, doi: 10.1109/MEMSYS.2018.8346658.

* cited by examiner

DUAL PROOF-MASS RESONATORS WITH LOW SUPPORT LOSS

TECHNICAL FIELD

The present disclosure relates to dual proof-mass resonators with less support loss. In particular, the dual proof-mass resonators include two identical proof-masses adapted to vibrate in the same phase in a direction perpendicular to a direction of a connecting beam. The resonators may be in various shapes, such as a rectangular shape.

BACKGROUND

Resonators are popular and widely being used for different applications, but they have relatively high support loss which degrades their quality factor. As the resonator is vibrating, part of the acoustic energy leaks into the substrate and gets dissipated.

There has been extensive effort to reduce a support loss by either making changes to the anchor(s) or the resonant body and/or even the substrate. However, there are still some highly popular resonators that may not have low enough support loss.

Hence, there is a need for the technique for reducing support loss (or anchor loss) in mechanical resonators.

SUMMARY

In one aspect, a mechanical resonator includes two identical proof-masses adapted to oscillate in a same phase in a direction perpendicular to a direction of a connecting beam, at least one connecting beam connecting the two identical proof-masses, and at least one anchor attached to a middle of the at least one connecting beam.

In one embodiment, two identical proof-masses are resonant plates, and the at least anchor is anchored to a substrate.

The at least anchor may comprise two anchors attached to a middle of the at least one connecting beam in opposite directions.

Also, the at least one connecting beam comprises an outer ring at a middle thereof, and the at least anchor is disposed at a center of the outer ring and is connected to the outer ring via two sub-connecting beams.

The outer ring may be in a rectangular ring shape.

Alternatively, the outer ring may be in a circular ring shape.

In an embodiment using electrostatic transduction, a direct current (DC) bias voltage is applied to the whole mechanical resonator.

In an embodiment using piezoelectric transduction, an alternating current (AC) voltage signal is applied to one port of the mechanical resonator, and a resultant AC voltage or current signal is measured using the other port of mechanical resonator.

For the piezoelectric transduction, each of the two resonant plates is made of a piezoelectric material or comprises a semiconductor layer covered by a thin layer of a piezoelectric material.

Furthermore, each of the two resonant plates further comprises a patterned metal layer formed as an electrode on a top of the thin layers of the piezoelectric material.

The mechanical resonator may further includes a first anchor, and a second anchor, wherein one end of the first anchor is electrically connected to a patterned metal layer formed on one of the two resonant plates, and another end of the first anchor is anchored in a ground, and one end of the second anchor is electrically connected to a patterned metal layer formed on a remaining one of the two resonant plates, and another end of the second anchor is anchored in a ground.

In yet another embodiment, each of the two resonant plates are divided into upper and lower sections, wherein a first patterned metal layer is formed on the upper sections of the two resonant plates, and a second patterned metal layer is formed on the lower sections of the two resonant plates.

The connecting beam also may be divided into an upper section covered by the first patterned metal layer, and a lower section covered by the second patterned metal layer.

Also, the AC voltage signal may be applied to the first and second patterned metal layers.

In still another embodiment, each of the two resonant plates are divided into outer and inner sections, wherein a first patterned metal layer is formed on the outer sections of the two resonant plates, and a second patterned metal layer is formed on the inner sections of the two resonant plates.

In the embodiment, the at least one connecting beam may include first and second connecting beams, wherein the first connecting beam is at least partially covered by the first patterned metal layer, and the second connecting beam is at least partially covered by the second patterned metal layer.

Also, the first connecting beam comprises a first anchor, wherein one end of the first anchor is electrically connected to the first patterned metal layer, and the other end of the first anchor is anchored in a ground, and In addition, the second connecting beam comprises a second anchor, wherein one end of the second anchor is electrically connected to the second patterned metal layer, and the other end of the second anchor is anchored in a ground.

Other aspects, advantages, and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, coupled to or with, be communicable with, cooperate with, interleave, juxtapose, be proximate to, be bound to or with, have, have a property of, or the like. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, it should be noted that like reference numbers are used to depict the same or similar elements, features, and structures.

DETAILED DESCRIPTION

FIGS. 1A through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system and method. The following description with reference to the accompanying drawings is provided to assist in a comprehensive understanding of various embodiments of the present disclosure as defined by the claims and their equivalents. It includes various specific details to assist in that understanding but these are to be regarded as mere examples. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

It should be apparent to those skilled in the art that the following description of various embodiments of the present disclosure is provided for illustration purpose only and not for the purpose of limiting the present disclosure as defined by the appended claims and their equivalents.

Although ordinal numbers such as "first," "second," and so forth will be used to describe various components, those components are not limited herein. The terms are used only for distinguishing one component from another component. For example, a first component may be referred to as a second component and likewise, a second component may also be referred to as a first component, without departing from the teaching of the inventive concept.

The terminology used herein is for the purpose of describing various embodiments only and is not intended to be limiting. As used herein, the singular forms are intended to include the plural forms as well, unless the context clearly indicates otherwise. It will be further understood that the terms "comprises" and/or "has," when used in this specification, specify the presence of a stated feature, number, step, operation, component, element, or a combination thereof, but do not preclude the presence or addition of one or more other features, numbers, steps, operations, components, elements, or combinations thereof.

Anchor loss can impact the resonator in several ways. First, it can reduce the overall quality factor of the resonator, and it can make a quality factor of the resonator dependent on substrate boundary conditions and stress. Second, the anchor loss makes the resonator susceptible to repeatability and hysteresis issues. The present disclosure provides the mechanical resonators designed to reduce the anchor losses during the operation.

Figure 1A:
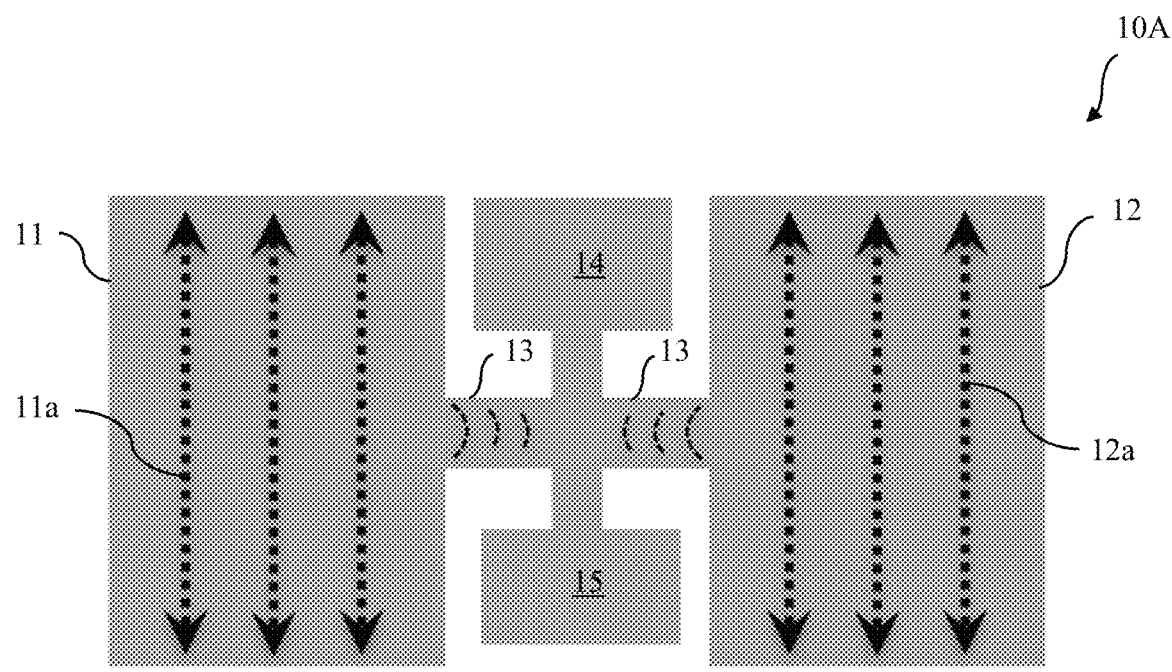
FIG. 1A illustrates an example schematic diagram of a mechanical resonator with two plates adapted to oscillate in a direction perpendicular to a direction of a connecting beam according to one embodiment of the present disclosure.
Figure 1B:
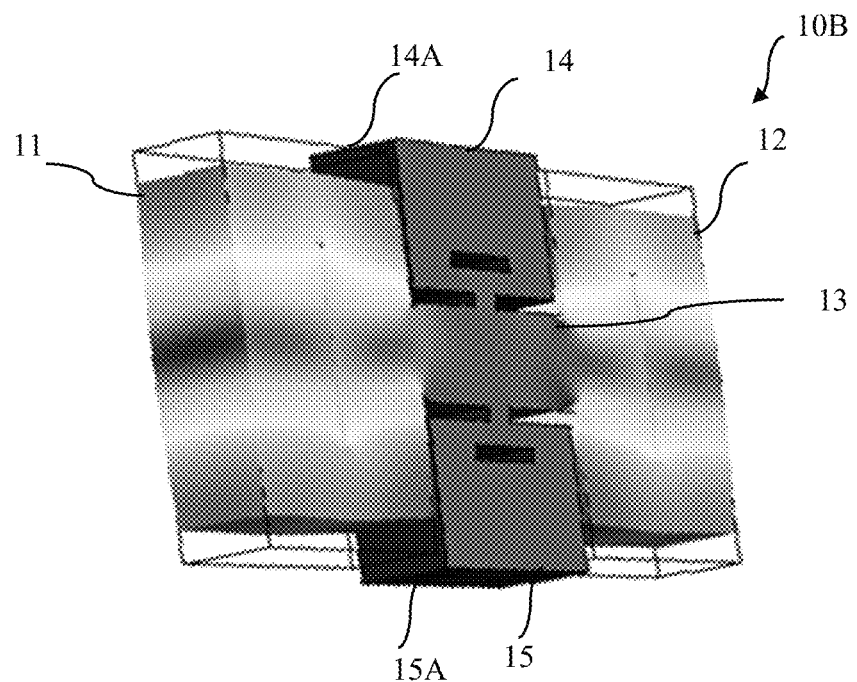
FIG. 1B illustrates an example image of a vibrating mechanical resonator with two plates adapted to oscillate in a direction perpendicular to a direction of a connecting beam according to one embodiment of the present disclosure.

FIG. 1A illustrates an example schematic diagram of a mechanical resonator 10A, according to one embodiment of the present disclosure. FIG. 1B illustrates an example image 10B of the vibrating mechanical resonator with two anchors according to one embodiment of the present disclosure.

Mechanical resonator 10 includes two resonant plates 11, 12, two anchors 14, 15, and connecting beam 13 connecting two anchors 14, 15 to resonant plates 11, 12. The connecting beam 13 may be connected to the nodal points of the resonant plates 11, 12. Two resonant plates 11, 12 vibrate in the arrow direction 12a, which is perpendicular to the direction of connecting beam 13.

Resonant plates 11, 12, anchors 14, 15, and connecting beam 13 may be etched into a substrate; for example, a substrate with silicon, doped silicon, N-type silicon, P-type silicon, silicon oxide, silicon carbide, germanium, and the like.

Two resonant plates 11, 12 are two identical proof-masses that are connected through connecting beam 13. Two resonant plates 11, 12 can come in various sizes and/or shapes. In one embodiment, two resonant plates 11, 12 may be in rectangular shape. For example, the two resonant plates 11 and 12 can be in any size between a 10 µm×10 µm square and 1 m×1 m square.

Anchors 14, 15 can be etched from substrate 14A and 15A made of various materials, such as N or P-type silicon, silicon oxide, silicon carbide, germanium, and the like.

For actuating the two resonant plates, electrostatic or piezoelectric transduction may be used for mechanical resonator 10. Alternatively, piezoresistive, electromagnetic, or thermal transduction may be used for mechanical resonator 10. In case of the electrostatic transduction, a DC voltage is applied to the whole resonator including resonant plates and connecting beams. In case of the piezoelectric transduction, an AC voltage signal is applied to one port (e.g., an electrode on a resonant plate) of mechanical resonator 10 and a resultant AC voltage or current signal is measured using the other port (e.g., an anchor or a beam) of mechanical resonator 10.

As a result of the electrostatic or piezoelectric transduction, two resonant plates 11, 12 oscillate in the same phase in the arrow directions 11a, 12a, which are perpendicular to the direction of connecting beam 13.

With the above structure, each acoustic energy leaking from two resonant plates 11, 12 into the connecting beam 13 will be in equal magnitude but opposite in direction and thus cancel each other out at the center of the connecting beam.

The two anchors 14, 15 may be attached to the center of connecting beam 13 in opposite directions. The center of the connecting beam is a good place to anchor the resonator 10 because a support loss can be minimized due to the cancellation of each acoustic energy leaking from two resonant plates 11, 12.

Figure 2:
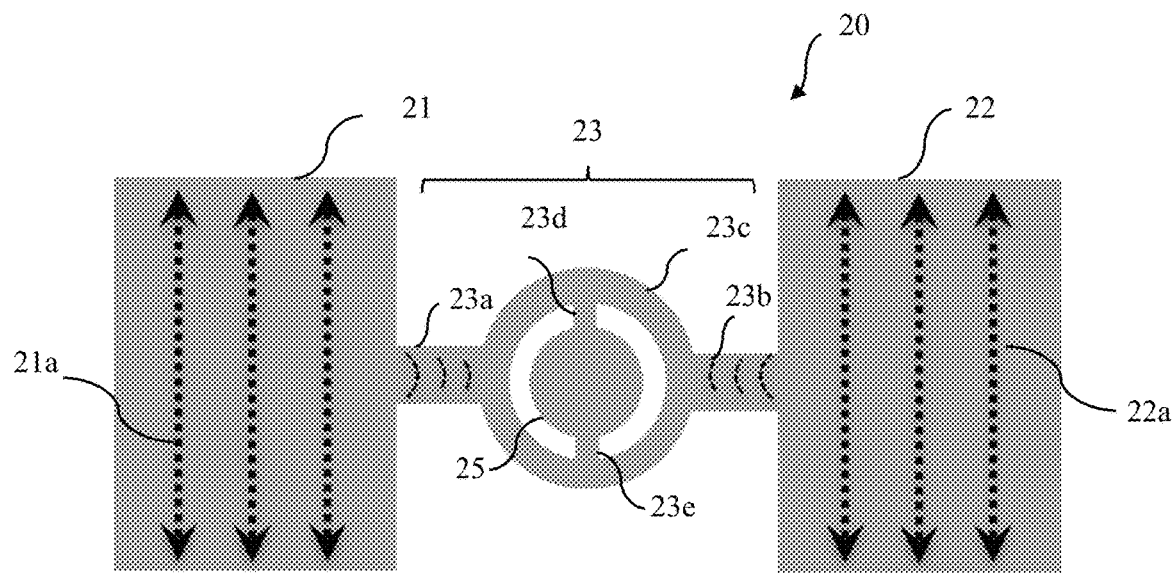
FIG. 2 illustrates an example schematic diagram of a mechanical resonator with two plates adapted to oscillate in a direction perpendicular to a direction of a connecting beam and one anchor according to one embodiment of the present disclosure.

FIG. 2 illustrates an example schematic diagram of a mechanical resonator 20 with one anchor, according to one embodiment of the present disclosure.

Similar to FIG. 2, the mechanical resonator 20 includes two resonant plates 21, 22, connecting structure 23, and anchor 28. Two resonant plates 21, 22 may be two identical proof-masses that are connected through a beam. The repetitive descriptions of the same components will be omitted for brevity.

Connecting structure 23 comprises outer ring 23c in the middle, and anchor 25 is disposed at the center of outer ring 23c via two inner-connecting beams 23d and 23e. In this embodiment, the outer ring 23c is in a circular ring shape.

Anchors 25 are disposed at the center of connecting beam 23, where each acoustic energy leaking from two resonant plates 21, 22 are cancelled out each other and thus a support loss can be minimized. Also, anchor 25 can be etched from a substrate made of various materials, such as N or P-type silicon, silicon oxide, silicon carbide and germanium.

With the electrostatic or piezoelectric transduction, two resonant plates 21, 22 oscillate in the same phase in the arrow directions 21a, 22a, which are perpendicular to the direction of connecting beam 23.

Figure 3:
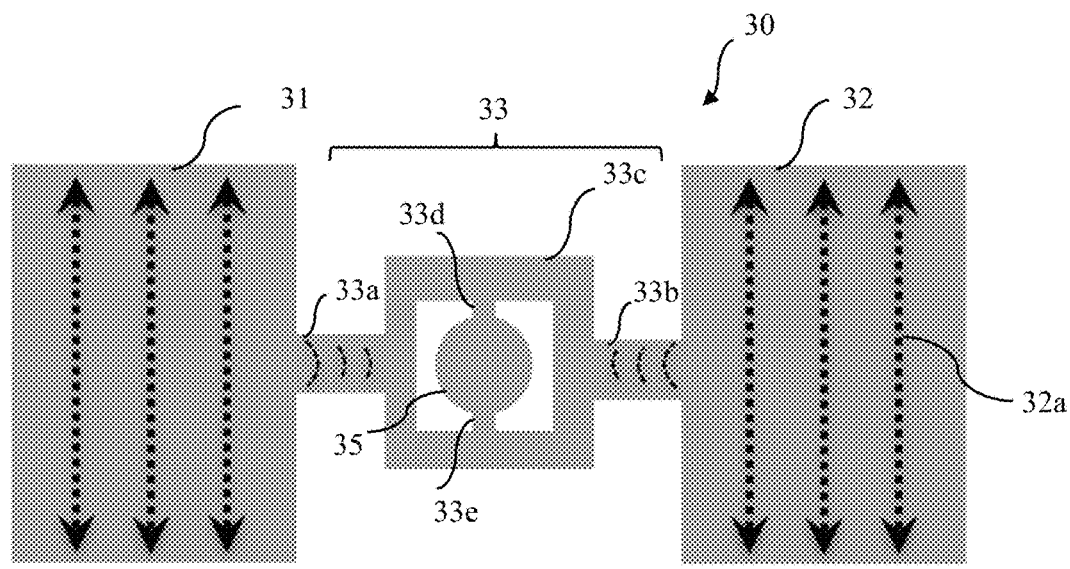
FIG. 3 illustrates another example schematic diagram of a mechanical resonator with two plates adapted to oscillate in a direction perpendicular to a direction of a connecting beam and one anchor according to one embodiment of the present disclosure.

FIG. 3 illustrates another example schematic diagram of a mechanical resonator 30 with one anchor, according to one embodiment of the present disclosure.

Similar to FIG. 2, the mechanical resonator 30 includes two resonant plates 31, 32, connecting structure 33, and anchor 38. The repetitive descriptions of the same components will be omitted for brevity.

Connecting structure 33 comprises outer ring 33c in the middle, and anchor 35 is disposed at the center of outer ring 33c via two inner-connecting beams 33d and 33e. In this embodiment, the outer ring 33c is in a rectangular ring shape. Also, resonant plates 31 and 32 can also have various shapes, as rectangles, circles, polygons, and the like. The inner-connecting beams 33d and 33e may be connected to the nodal points of the resonant plates 31, 32.

With the electrostatic or piezoelectric transduction, two resonant plates 31, 32 oscillate in the same phase in the arrow directions 31a, 32a, which are perpendicular to the direction of connecting beam 33.

Figure 4:
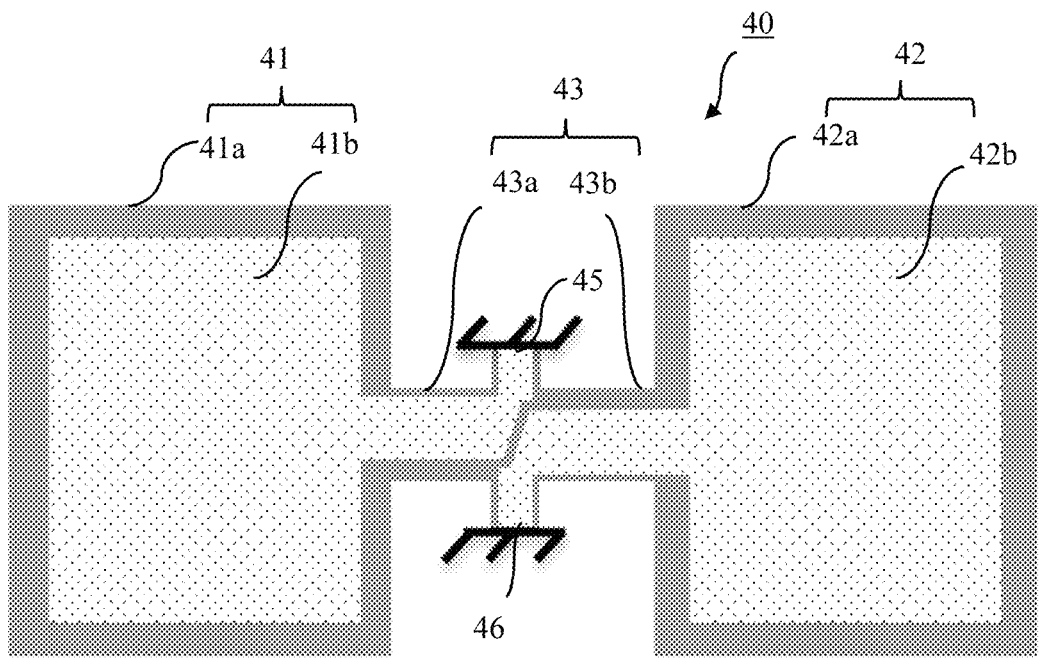
FIG. 4 illustrates an example schematic diagram of a mechanical resonator with two plates adapted to oscillate in a direction perpendicular to a direction of a connecting beam and two anchors according to one embodiment of the present disclosure.

FIG. 4 illustrates an example schematic diagram of a mechanical resonator 40 with two anchors and patterned electrodes according to one embodiment of the present disclosure.

Similar to FIG. 2, mechanical resonator 40 includes two resonant plates 41, 42 connecting beam 43 connecting two anchors 45, 46 to resonant plates 41, 42. The repetitive descriptions of the same components will be omitted for brevity.

Each of two resonant plates 41, 42 comprises a semiconductor layer covered by a thin layer of a piezoelectric material. The patterned metal layers 41b, 42b are formed as the electrodes on the top of thin layers 41a, 42a of the piezoelectric material.

One end of anchor 45 is electrically connected to the patterned metal layers 41b and the other end of anchor 45 is anchored in the ground; and one end of anchor 46 is electrically connected to the patterned metal layers 42b and the other end of anchor 46 is anchored in the ground.

Similarly, when an AC voltage signal is applied to the electrodes to generate the piezoelectric transduction, two resonant plates 41, 42 oscillate in the same phase in the direction perpendicular to the direction of connecting beam 43.

Figure 5:
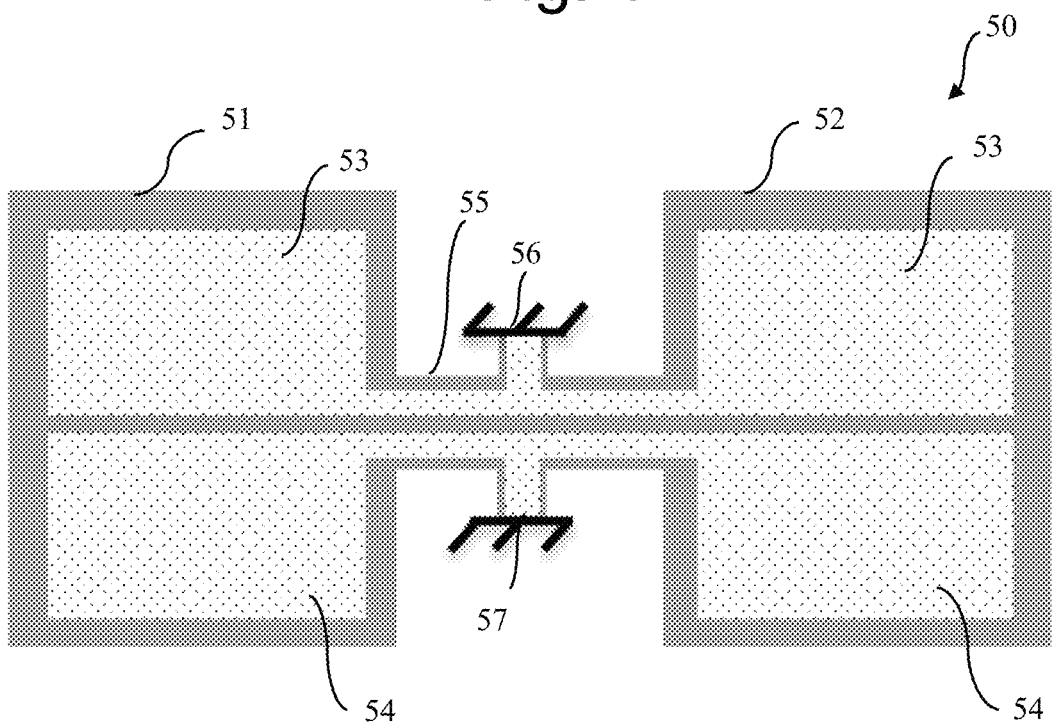
FIG. 5 illustrates another example schematic diagram of a mechanical resonator with two plates adapted to oscillate in a direction perpendicular to a direction of a connecting beam and two anchors according to one embodiment of the present disclosure.

FIG. 5 illustrates another example schematic diagram of a mechanical resonator 50 with two anchors and patterned electrodes according to one embodiment of the present disclosure.

Similar to FIG. 4, mechanical resonator 50 includes two resonant plates 51, 52, and connecting beam 55 connecting two anchors 56, 57 to resonant plates 51, 52. The repetitive descriptions of the same components will be omitted for brevity.

In this embodiment, two resonant plates 51, 52 each are divided into the upper and lower sections. Patterned metal layer 53 is formed on the upper sections of resonant plates 51, 52, and patterned metal layer 54 is formed on the lower sections of resonant plates 51, 52. Connecting beam 55 also may be divided into the upper and lower sections, which are covered by patterned metal layers 53, 54.

When an AC voltage signal may be applied to patterned metal layers 53, 54, two resonant plates 51, 52 oscillate in the same phase in the direction perpendicular to the direction of connecting beam 55.

Figure 6:
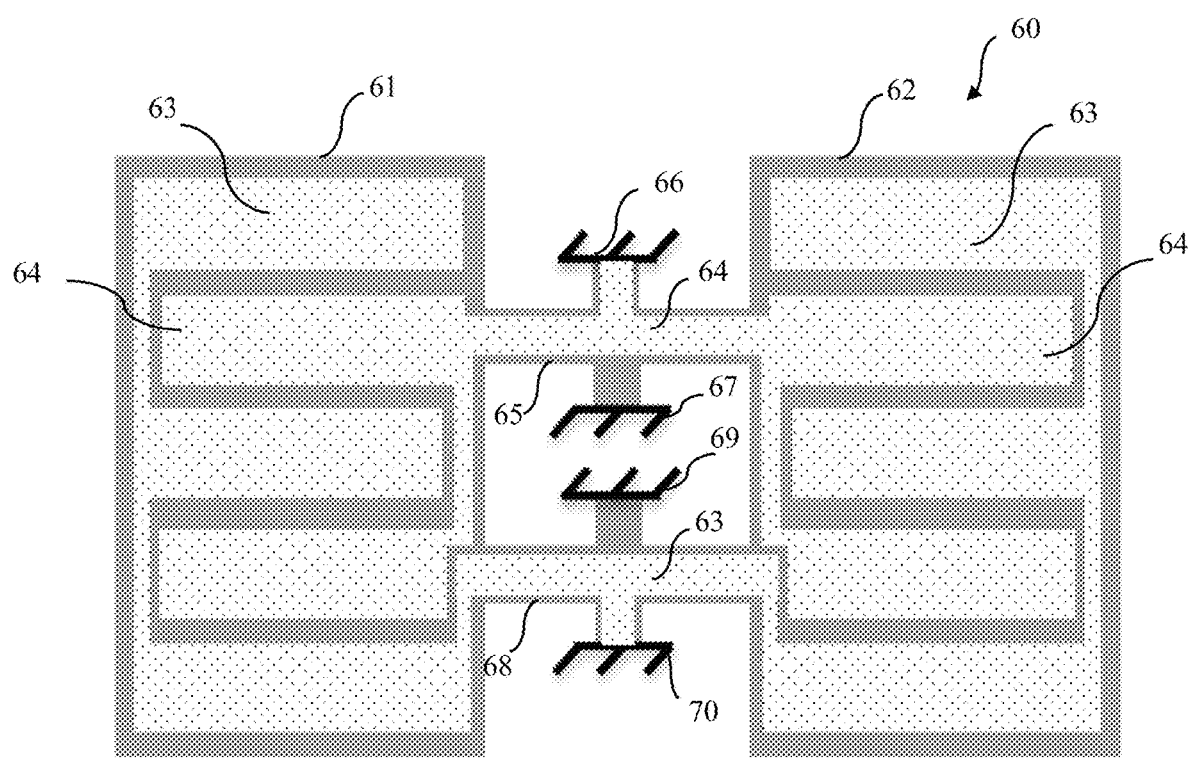
FIG. 6 illustrates another example schematic diagram of a mechanical resonator with two plates adapted to oscillate in a direction perpendicular to a direction of a connecting beam and four anchors according to one embodiment of the present disclosure.

FIG. 6 illustrates still another example schematic diagram of a mechanical resonator 60 with two anchors and patterned electrodes according to one embodiment of the present disclosure.

Similar to FIG. 2, mechanical resonator 60 includes two resonant plates 61, 62, and connecting beams 65, 68. Two anchors 66, 67 are disposed at the center of connecting beams 65 in opposite directions; and two anchors 69, 70 are disposed at the center of connecting beams 68 in opposite directions. The repetitive descriptions of the same components will be omitted for brevity.

In this embodiment, two resonant plates 61, 62 each are divided into the inner and outer sections. Patterned metal layer 63 is formed on the outer sections of resonant plates 61, 62, and is connected to anchor 66 that is anchored in the ground. Patterned metal layer 64 is formed on the inner sections of resonant plates 61, 62, and is connected to anchor 70 that is anchored in the ground.

When an AC voltage signal may be applied to patterned metal layers 63, 64 to generate the piezoelectric transduction, two resonant plates 61, 62 oscillate in the same phase in the direction perpendicular to the direction of connecting beams 65, 68.

The above mechanical resonators may be rectangular proof-mass resonators made of a single semiconductor material (e.g., a single crystalline-silicon) vibrating in their bulk acoustic width/length extensional mode. These resonators can function in the first extensional mode or any of the higher modes. Such resonators made of silicon are called Silicon Bulk Acoustic Wave Resonator (SiBAR).

Another example of the above resonators may be composed of a semiconductor layer covered by a thin layer of piezoelectric material and also a patterned metal layer on the top to form the electrodes. These resonators can have mode-shapes similar to the modes of the SiBAR. Such resonators made of Silicon may be called Thin-film Piezoelectric on Silicon (TPoS) resonators.

Yet another example of the above resonators may be contour mode resonators, which are made of a piezoelectric material. In addition, there are patterned metal layers on the top side (and even the bottom side) that would serve as electrodes. The mode-shape can be similar to the above other resonators.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A mechanical resonator comprising:
two identical proof-masses adapted to oscillate in a same phase in a direction perpendicular to a direction of at least one connecting beam, the at least one connecting beam connecting the two identical proof-masses; and
at least one anchor attached to a middle of the at least one connecting beam,
wherein the at least one connecting beam comprises an outer ring at a middle thereof, and
wherein the at least anchor is disposed at a center of the outer ring and is connected to the outer ring via two sub-connecting beams.

2. The mechanical resonator according to claim 1, wherein two identical proof-masses are resonant plates, and the at least anchor is anchored to a substrate.

3. The mechanical resonator according to claim 1, wherein the at least anchor comprises two anchors attached to a middle of the at least one connecting beam in opposite directions.

4. The mechanical resonator according to claim 1, wherein the outer ring is in a rectangular ring shape.

5. The mechanical resonator according to claim 1, wherein the outer ring is in a circular ring shape.

6. The mechanical resonator according to claim 1, wherein in case of using electrostatic transduction, a DC bias voltage is applied to the whole mechanical resonator.

7. The mechanical resonator according to claim 1, wherein in case of using piezoelectric transduction, each of the two resonant plates comprises a semiconductor layer covered by a thin layer of a piezoelectric material.

8. The mechanical resonator according to claim 7, wherein each of the two resonant plates further comprises a patterned metal layer formed as an electrode on a top of the thin layers of the piezoelectric material.

9. The mechanical resonator according to claim 8, wherein an AC voltage signal is applied to patterned metal layers of each of the two resonant plates.

10. The mechanical resonator according to claim 8, comprising:
a first anchor; and
a second anchor, wherein
one end of the first anchor is electrically connected to a patterned metal layer formed on one of the two resonant plates, and another end of the first anchor is anchored in a ground; and
one end of the second anchor is electrically connected to a patterned metal layer formed on a remaining one of the two resonant plates, and another end of the second anchor is anchored in a ground.

11. The mechanical resonator according to claim 9,
wherein each of the two resonant plates are divided into upper and lower sections,
wherein a first patterned metal layer is formed on the upper sections of the two resonant plates, and
wherein a second patterned metal layer is formed on the lower sections of the two resonant plates.

12. A mechanical resonator comprising:
two identical proof-masses adapted to oscillate in a same phase in a direction perpendicular to a direction of at least one connecting beam, the at least one connecting beam connecting the two identical proof-masses; and
at least one anchor attached to a middle of the at least one connecting beam,
wherein each of the two resonant plates are divided into outer and inner sections,
wherein a first patterned metal layer is formed on the outer sections of the two resonant plates, and
wherein a second patterned metal layer is formed on the inner sections of the two resonant plates.

13. The mechanical resonator according to claim 12,
wherein the at least one connecting beam comprises first and second connecting beams,
wherein the first connecting beam is at least partially covered by the first patterned metal layer, and
wherein the second connecting beam is at least partially covered by the second patterned metal layer.

14. The mechanical resonator according to claim 13,
wherein the first connecting beam comprises a first anchor, wherein one end of the first anchor is electrically connected to the first patterned metal layer, and the other end of the first anchor is anchored in a ground, and
wherein the second connecting beam comprises a second anchor, wherein one end of the second anchor is electrically connected to the second patterned metal layer, and the other end of the second anchor is anchored in a ground.

15. A mechanical resonator comprising:
two identical proof-masses adapted to oscillate in a same phase in a direction perpendicular to a direction of at least one connecting beam, the at least one connecting beam connecting the two identical proof-masses; and
at least one anchor attached to a middle of the at least one connecting beam,
wherein in case of using piezoelectric transduction, each of the two resonant plates comprises a semiconductor layer covered by a thin layer of a piezoelectric material, and
wherein each of the two resonant plates further comprises a patterned metal layer formed as an electrode on a top of the thin layers of the piezoelectric material.

16. The mechanical resonator according to claim 15, wherein an AC voltage signal is applied to patterned metal layers of each of the two resonant plates.

17. The mechanical resonator according to claim 15, comprising:
a first anchor; and
a second anchor, wherein
one end of the first anchor is electrically connected to a patterned metal layer formed on one of the two resonant plates, and another end of the first anchor is anchored in a ground; and
one end of the second anchor is electrically connected to a patterned metal layer formed on a remaining one of the two resonant plates, and another end of the second anchor is anchored in a ground.

18. The mechanical resonator according to claim 16,
wherein each of the two resonant plates are divided into upper and lower sections,
wherein a first patterned metal layer is formed on the upper sections of the two resonant plates, and
wherein a second patterned metal layer is formed on the lower sections of the two resonant plates.

19. The mechanical resonator according to claim 18, wherein the connecting beam is divided into an upper section covered by the first patterned metal layer, and a lower section covered by the second patterned metal layer.

20. The mechanical resonator according to claim 18, wherein the AC voltage signal is applied to the first and second patterned metal layers.

\* \* \* \* \*